United States Patent [19]

Hartmann

[11] Patent Number: 5,256,584
[45] Date of Patent: Oct. 26, 1993

[54] METHOD FOR PRODUCING A NON-VOLATILE MEMORY CELL USING SPACERS

[75] Inventor: Joël Hartmann, Claix, France

[73] Assignee: Commissariat A L'Energie Atomique, France

[21] Appl. No.: 877,082

[22] Filed: May 22, 1992

[30] Foreign Application Priority Data

Jun. 7, 1991 [FR] France .................. 91 06944

[51] Int. Cl.⁵ ......................................... H01L 21/266
[52] U.S. Cl. ........................................ 437/43; 437/44; 437/52; 148/DIG. 111
[58] Field of Search ............... 437/43, 44, 195, 984; 357/23.5; 148/DIG. 111

[56] References Cited

U.S. PATENT DOCUMENTS

| 4,661,833 | 4/1987 | Mizutani | 357/23.5 |
| 4,852,062 | 7/1989 | Baker | 437/43 |
| 5,041,886 | 8/1991 | Lee | 357/23.5 |
| 5,063,172 | 11/1991 | Manley | 437/43 |
| 5,073,513 | 12/1991 | Lee | 437/43 |
| 5,120,672 | 6/1992 | Mitchell et al. | 437/43 |

FOREIGN PATENT DOCUMENTS 0164781 12/1985 European Pat. Off. .
0299853 1/1989 European Pat. Off. .
4016346A1 2/1991 Fed. Rep. of Germany .

Primary Examiner—Brian E. Hearn
Assistant Examiner—C. Chaudhari
Attorney, Agent, or Firm—Pearne, Gordon, McCoy & Granger

[57] ABSTRACT

Method for producing a non-volatile memory cell and obtained memory cell. This method consists of embodying strips in a stacking of one nonconducting film and one conductive film, both films intended to respectively form the gate nonconductors (210) and the floating gates (208) of transistors, of forming spacers (230) on the flanks of the strips of said stacking, of eliminating the spacers on the side of the drains of the memory points to be embodied, of implanting ions of a type with conductivity differing from that of the substrate by using the remaining spacers and the strips of said stacking as a mask so as to form the sources and drains (214, 216) of the transistors, respectively offset and aligned with respect to said strips, of eliminating the remaining spacers, of forming a thin electric nonconducting film (208) on the sources and drains of the transistors, of embodying conductive strips (206a) perpendicular to the diffused source and drain zones, and of etching the strips of said stacking by using the conductive strips as a mask.

10 Claims, 5 Drawing Sheets

METHOD FOR PRODUCING A NON-VOLATILE MEMORY CELL USING SPACERS

FIELD OF THE INVENTION

The present invention concerns a method for producing an integrated non-volatile memory cell with a floating gate, as well as the cell thus obtained. More specifically, the invention concerns the production of EPROM (erasable programmable read-only memory) and EEPROM (electrically erasable programmable read-only memory) memory cells, these memories possibly being of the flash type.

BACKGROUND OF THE INVENTION

In particular, the invention is applicable for the production of MOS or CMOS type integrated memory circuits.

An integrated EEPROM or EPROM memory is an integrated circuit including one actual memory portion known as a memory cell formed from a matrix of several electrically interconnected memory points and peripheral circuits used to control the memory points.

The invention solely deals with the actual memory portion.

The invention is adapted to any generation of drawing rules. It is nevertheless applicable to the embodiment of non-volatile memories with a high integration density allowing at least for the storage of 10 binary elements ($\geq 1$ Mbits). In fact, this method makes it possible to reduce the surface of the memory point and thus mainly concerns memory cells with micronic or submicronic drawing rules and typically with floating gate widths of 0.6 $\mu$m.

FIGS. 1 and 2 diagrammatically show one known type of EPROM memory cell embodied and drawn according to the conventional cells concept or with a T shape; FIG. 1 is a top view and FIG. 2 is a longitudinal section along the direction II—II of FIG. 1.

For the purpose of simplification, this cell comprises per memory point 2 one floating gate 4 and one polycrystalline silicon control gate 6 stacked and isolated from each other by an intergate nonconductor 8, one gate nonconductor 10 inserted between the silicon substrate 12 and the floating gate 4, one source zone 14 diffused in the substrate 12, one drain zone 16 diffused in the substrate and one metallic electric half-contact 18. The reference D denotes all the diffused zones. Each drain zone 16 is common to two consecutive memory points.

Each memory point is the result of the crossing of a line of words 6a formed as the gate 6 in the upper polycrystalline silicon film and the line 18a of binary elements, hereinafter referred to as bits, embodied in the same film as the electric half-contact.

This type of memory point has been used for a large number of years from the generations of several kilobits up to the currently most advanced circuits of between 4 and 16 Mbits.

It main advantage resides in the wide experience acquired by EPROM memory manufacturers concerning this type of memory point and the foreseeable continuity when a memory generation advances to the next one.

However, with the increase in density integration, it is becoming increasingly difficult to make this memory evolve to having smaller dimensions as misalignments from level to level represent a considerable portion of its surface. For example, the memories of 1 Mbits embodied with conventional T memory points currently have a surface of about 45 mm2 for a memory point surface of between 18 and 20 $\mu$m2, and memories of 4 Mbits have a surface of between about 70 and 80 mm2 for a memory point surface of between 9 and 10 $\mu$m2.

Moreover, the traditional memory cell comprises one half-contact per memory point and for densities of several megabits, several millions of contacts are embodied in the circuit; this then poses the problem of the density of defects concerning this type of metallization requiring significant control of the latter and possibly resulting in circuits malfunctioning on account of incorrect electric connection.

Several years ago, Boaz Eitan of the Wafer Scale Integration company proposed a new type of EPROM memory point known as a "Self-aligned Split gate EPROM". This memory point with a "split" gate is described in detail in the document U.S. Pat. No. 4,639,893 of Jan. 27, 1987.

FIGS. 3 and 4 diagrammatically show a known type of a "split gate" EPROM memory cell; FIG. 3 is a top view and FIG. 4 is a longitudinal cutaway view along the line IV—IV of FIG. 3.

These figures show for each memory point 102 the floating gate 104 and the control gate 106 isolated by the intergate nonconductor 108, the gate nonconductor 110, and the source 114 and drain 116 zones diffused in the substrate 112. The gates 104 and 106 are made of polycrystalline silicon. The control gates 106 are constituted by the portion of the lines of words 106a opposite the floating gates 104.

This memory point 102 has the advantage of being formed via the crossing of lower polycrystalline silicon blocks 104 and lines of upper polycrystalline silicon lines of words 106a. In addition, this memory point has the advantage of not comprising any electric contact; the contact of the bit lines (that is on the drain lines) is solely taken up every 16 or even 32 memory points.

This "split gate" memory point thus allows, with drawing rules identical to those of the T-shaped cells, a smaller surface of memory points to be obtained whilst considerably reducing the electric contact number in the memory plane. Thus, using this concept, the WSI company recently announced the embodiment of an EPROM memory of 1 Mbits, a surface of 26 mm2 with memory points of 9.5 $\mu$m, then a memory of 4 Mbits, a surface of 65 mm2 embodied with the same memory point dimensions.

To this effect, reference may be made to the article in VLSI Symposium on Circuits, Kyoto, 1989 by S. All and al and entitled "A new staggered Virtual Ground array architecture Implemented in a 4Mb CMOS EPROM", pp. 35-36.

Moreover, the conception of the "split gate" memory point includes the embodiment of an access transistor connected in series with the double polycrystalline silicon gate.

In the rest of the description, the lower film of polycrystalline silicon shall be denoted as poly-1 and the upper polycrystalline silicon film as poly-2.

This access transistor is embodied by the separation zone 120 between the source zone 114, generally of the type N+, and the floating gate 104. This separation zone, controlled by the poly-2 gate of the line of words, modulates the effective electric length of the channel of the memory point according to the voltage applied to the poly-2.

When the voltage of the poly-2 gate (or line of words) is nil, this channel zone controlled by the poly-2 is blocked and the memory point does not operate. This makes it possible to considerably reduce the stray current of the memory points of a given progamming addressed line of bits but not situated on the same line of words ; this stray current is induced via the coupling of the drain with the floating gate (turn-on phenomenon).

This access transistor also makes it possible to envisage electric widths under the floating gate much smaller than those of the T memory points without running the risk of piercing between the source and drain of the memory points. Finally, it makes it possible to reduce the threshold voltage of the nonprogrammed memory points and thus increase their reading current.

However, this zone for separating the source and floating gate controlled by the line of words is embodied in the patent of Boaz Eitan by positioning a resin mask on the poly-1. If this masking is not critical for floating gate widths of about one micrometer, it becomes more difficult for submicronic floating gate widths (such as 0.6 $\mu$m for the generation of a 16 Mbit memory).

The misalignment of this mask with respect to the floating gates has in fact a direct effect on the width of the source of each series transistor and on the electric length (or channel) of the series MOS transistor.

All the drawbacks mentioned above also exist in flash or non-flash type EEPROM memories which merely constitute special EPROMS.

SUMMARY OF THE INVENTION

Accordingly, the object of the invention is to provide a method for embodying a non-volatile memory cell of the type without any electric contact in each memory point and with access transistors connected in series with the double gates making it possible to resolve the above-mentioned drawbacks. In particular, this method ensures an automatic alignment of the series transistor with respect to the floating gate of the associated memory point, thus making it possible to have a constant channel length of this transistor, as well as a fixed source length of said transistor.

The principle of the invention consists of using, for offsetting between the source and the floating gate of each memory point, a spacer embodied on the flanks of each floating gate, said spacer having the advantage of having a fixed size and being self-aligned with respect to the floating gate.

More specifically, the invention concerns a method for producing a non-volatile memory cell on a semiconductive substrate with a given type of conductivity and comprising :

a) - a matrix of memory points electrically isolated from one another and each provided with a stacking of one floating gate and one control gate both electrically isolated from each other, a gate nonconductor inserted between the floating gate and the substrate, one source and one drain formed in the substrate on both sides of the stacking, one channel situated under the floating gate having a length orientated along a direction extending from the source to the drain, and one access transistor connected in series to the stacking of the gates, b) - lines of words constituted by conductive strips parallel to this direction, this method including the following stages :

1) - embodying on the substrate a stacking of one electric nonconducting film and one conductive film intended to respectively form the gate nonconductors and the floating gates, 2) - etching of this stacking of films so as to form the strips of said stacking perpendicular to said direction, 3) - embodying of spacing strips on the flanks of the strips of said stacking and made of a material able to be selectively etched with respect to the conductive film of the stacking and to the substrate, 4) - elimination of the spacing strips on the side of the drains to be embodied, 5) - implantation of ions with conductivity differing from that of the substrate by using the remaining spacing strips and the strips of said stacking as a mask so as to form the sources and drains of the transistors respectively offset and aligned with respect to the strips of said stacking, 6) - elimination of the remaining spacing strips, 7) - forming of a thin electric nonconducting film on the sources and drains of the transistors and on the strips of said stacking, 8) - embodying of conductive strips on the strips of said stacking, these conductive strips being parallel to said direction and thus forming the control gates and the lines of words, and 9) - etching of the strips of said stacking by using said conductive strips as a mask so as to fix the dimensions of the floating gates and the gate nonconductors.

In other words, the lines of words and the control gates are merged in the same strips.

The memory cell obtained has the particular feature of not having any electric contact in the specific memory point and of having an access transistor connected in series with the stacking of gates ; this transistor is self-aligned with respect to the floating gate of each memory point and its dimensions are fixed.

By using a width and length of the floating gate both of 0.6 $\mu$m, it is posisble to attain with the method of the invention a memory point surface of 1.96 $\mu$m2, whereas currently the smallest memory point dimensions published with these drawing rules for T cells are about between 3.5 and 4$\mu$m, which corresponds to a gain close to 2 in terms of integration density.

According to the invention, it is possible to use control gates and lines of words made of metal (Al, W, Ta, Mo), a silicide of a refractory metal ($TiSi_2$, $TaSi_2$, $WSi_2$, $PtSi$) or made of polycrystalline silicon doped with phosphorus (0.5 to 2% in weight).

When the floating gates are made of polycrystalline silicon doped with phosphorus and the substrate is made of monocrystalline silicon, the thin electric nonconducting film formed during stage 7 is advantageously obtained by the thermic oxidation of the polycrystalline and monocrystalline silicon. In this case, the thermic oxidation of the polycrystalline silicon intended to produce the floating gates makes it possible to embody the inter-gate nonconductors.

It is possible to replace this thermic oxidation stage by depositing one or several electric nonconductors, such as silicon oxinitride, silicon nitride or silicon oxide.

When it is desired to embody the inter-gate nonconductors by means other than by the thermic oxidation of the polycrystalline silicon of the floating gates, it is preferable to protect these inter-gate nonconductors throughout all the subsequent stages of the production method.

Also, in one preferred embodiment, the method of the invention for producing a memory cell comprises the following stages:

i) - embodying on the substrate a stacking of one first electric nonconducting film intended to form the gate nonconductors, one first conductive film intended to form the floating gates, at least one second film of an electric nonconductor intended to form the intergate nonconductors, one second conductive film intended to embody the control gates and one protection film able to be selectively etched with respect to the second conductive film, ii) - etching of this stacking of films so as to form the strips of said stacking perpendicular to said direction, iii) - embodying spacing strips on the flanks of the strips of said stacking, these strips being made of a material able to be etched selectively with respect to the protection film and to the substrate, iv) - elimination of the spacing strips on the side of the drains to be embodied, v) - implantation of ions with conductivity differing from that of the substrate by using the remaining spacing strips and the strips of said stacking of films as a mask so as to form the sources and drains of the transistors respectively offset and aligned with respect to the strips of said stacking, vi) - elimination of the remaining spacing strips, vii) - forming a thin electric nonconducting film on the sources and drains of the transistors, viii) elimination of the protection film, ix) embodying conductive strips on the strips of said stacking obtained at viii), these conductive strips being parallel to said direction and thus forming the lines of words, and x) - etching of the strips of said stacking obtained at viii) by using said conductive strips as a mask so as to fix the dimensions of the control gates, the inter-gate nonconductors, the floating gates and the gate nonconductors.

Here, the lines of words and the control gates are distinct and made, for example, of two different conductive materials.

In this embodiment, the inter-gate nonconductors (that is the second nonconducting film) may be made with any type of nonconducting material and in particular via a trifilm stacking of silicon oxide, silicon nitride and silicon oxide, generally called ONO.

Moreover, in this embodiment, the second conductive film may be made of one of the silicides mentioned above or of polycrystalline silicon doped with between 0.5 and 2% in weight of phosphorus.

So as to use this conductive film so as to ensure the electric contact with the line of words of each memory point, it is necessary to protect this second conductive film against thermic oxidation by means of providing a protection film (see stage i). This protective film may be made of silicon nitride, for example.

The protection film also allows for etching of the spacing strips followed by a reoxidation of the surface and drain zones without modifying the structure of the inter-gate nonconductor and in particular the ONO stacking.

The spacing strips may be made of any electric nonconducting material, such as silicon nitride, silicon oxynitride or silicon oxide or even of nondoped polycrystalline silicon, the only restriction of these spacing strips being their aptitude for being selectively etched with respect to the subjacent materials (in particular with respect to the material intended for the floating gates of the memory points, the protection film and the substrate).

Similarly, the gate nonconductors may be made of silicon oxide or silicon oxynitride for example.

So as to reduce the access resistance of the lines of words, when these lines of words are made of doped polycrystalline silicon, it is possible to coat them with a silicide film of a refractory metal as referred to earlier.

BRIEF DESCRIPTION OF THE DRAWINGS

Other characteristics and advantages of the invention shall appear more readily from a reading of the following description, given by way of nonrestrictive illustration, with reference to the accompanying drawings on which FIGS. 1 and 2, already described, diagrammatically show one EPROM T-shaped memory cell according to the prior art.

DETAILED DESCRIPTION OF THE PREFERRED EMBODIMENTS

The following description refers to the production of an EPROM memory cell so as to simplify this description. However, as seen earlier, the invention can be applied more generally as it is applicable to all types of non-volatile memory cells.

The method shown below is described after the embodiment of the caissons N and P, field isolation, doping under the field nonconductor so as to isolate the active zones, sacrificial oxidation, as well as doping of the semiconductive substrate of the memory points so as to adjust the threshold voltage of these memory points. These elements are embodied as in the prior art.

Finally, the following description refers to a type P silicon monocrystalline substrate, this substrate bearing the reference 212.

Figure 1:
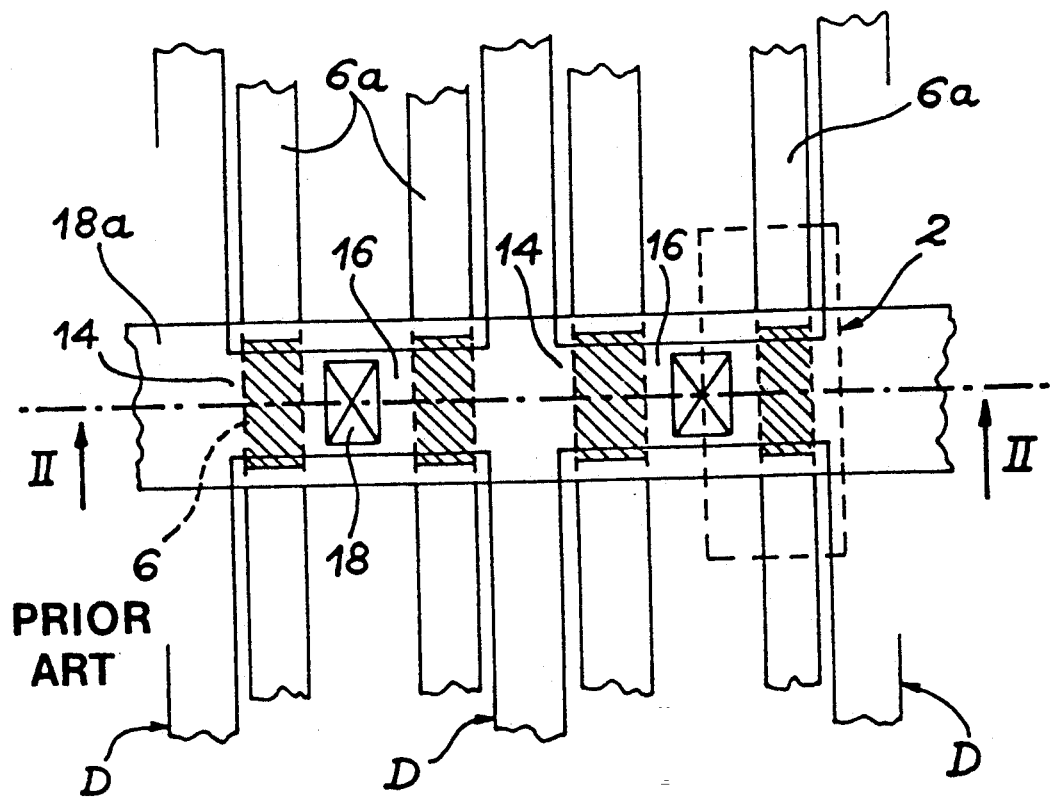
Figure 2:
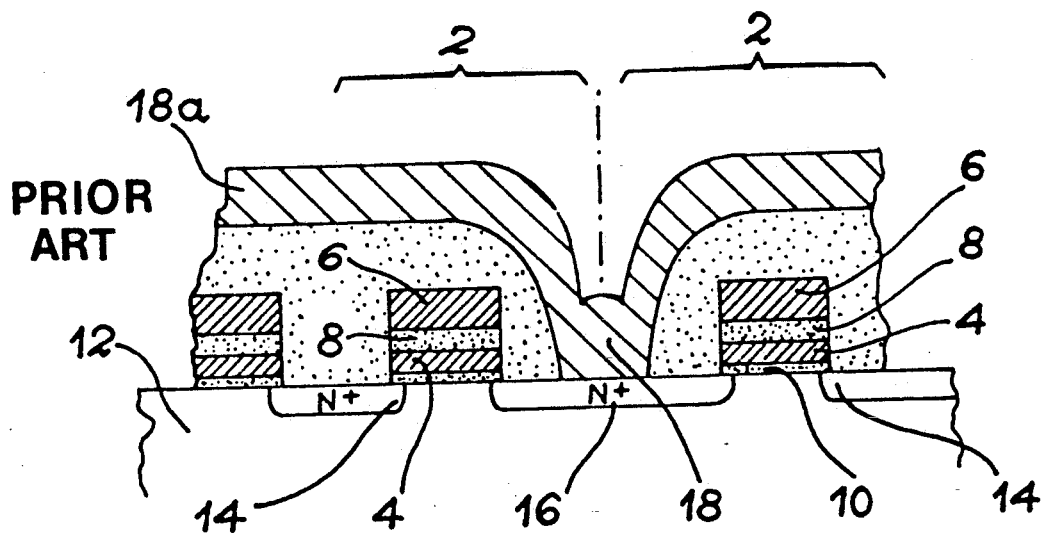
Figure 3:
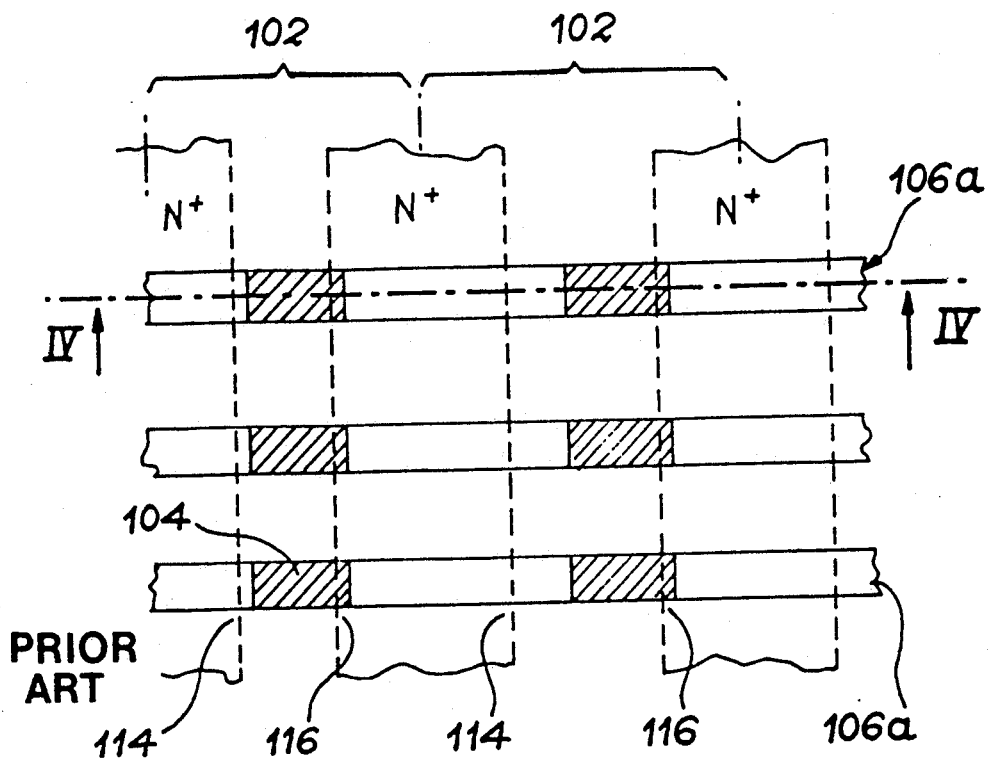
FIGS. 3 and 4, already described, diagrammatically show a known type of "split gate" memory cell.
Figure 4:
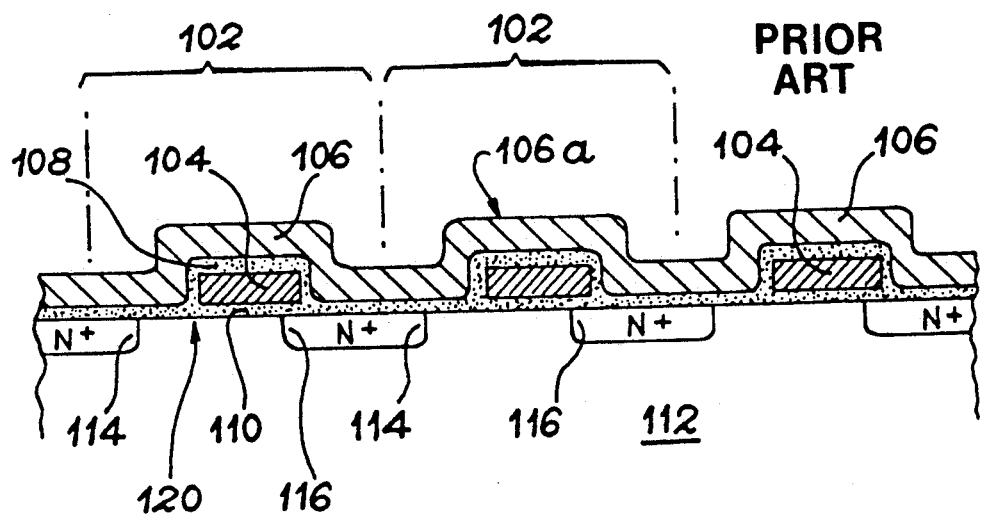
Figure 5:
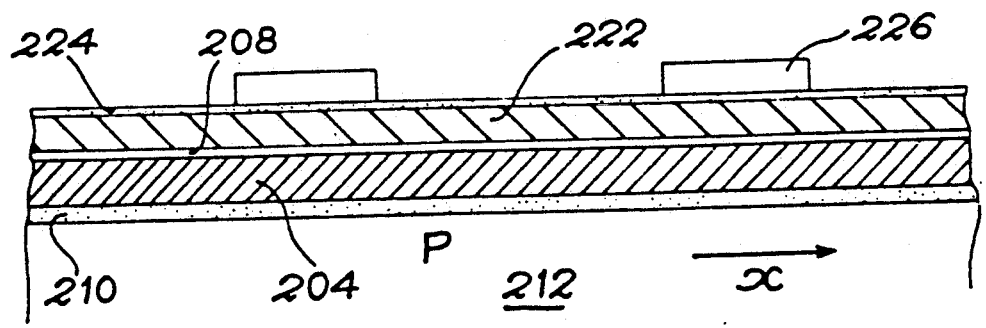
FIGS. 5 to 12 diagrammatically show the various stages of the method of the invention, FIGS. 5 to 11 being longitudinal sections and FIG. 12 a top view, and FIGS. 13 to 15 diagrammatically show a longitudinal section of one variant of the method of the invention.

As shown on FIG. 5, a thermic oxidation 210 is effected inside the memory plane of the silicon 212 over a thickness of 20 nm, for example, at a temperature of 1000° C. under dry oxygen. This thermic oxidation shall be used to embody the gate nonconductors.

Then a deposit is effected of the lower polycrystalline silicon 204 (poly-1) with a thickness of 150 nm by means of low pressure chemical vapor depositing. This deposit 204 shall be used for embodying the floating gate of the memory points.

This polycrystalline silicon 204 is then doped via the diffusion of phosphorus (0.5 to 2% in weight) in an oven at 950° C.

Then a nonconducting material 208 is deposited in which the inter-gate nonconductors are to be embodied. This deposit successively consists of one thermic oxidation of the polycrystalline silicon 204, one low pressure chemical vapor depositing of a fine nitride film (mixture of $NH_3$ and $SiH_2Cl_2$) at 800° C. and then a slight thermic reoxidation of this nitride so as to obtain an equivalent thickness in $SiO_2$ of this trifilm of 20 nm.

Then a 150 nm film of polycrystalline silicon 222 is deposited via low pressure chemical depositing at 620° C. The doping of this silicon (0.5 to 2% in weight) is also carried out via the diffusion of phosphorus in an oven at 950° C.

Finally, a fine film of silicon nitride 224 is deposited on this polycrystalline silicon film 222 by means of low pressure chemical vapor deposit at 800° C., this film 224 having a thickness of 50 nm. This film shall be used to avoid any reoxidation of the subjacent silicon film 222 during the source and drain reoxidation and thus shall allow for a good contact between this polycrystalline silicon and the bi-film (silicide+poly-2) of the lines of words.

After stacking of all these films, the first level of silicon (poly-1) is masked by means of slice direct photorepetition photolithography well-known to experts in this field. This mask fixes the dimension of the floating gates according to the direction x of the channels and masks the poly-1 zones to be preserved. It appears in the form of strips perpendicular to the direction x.

Figure 6:
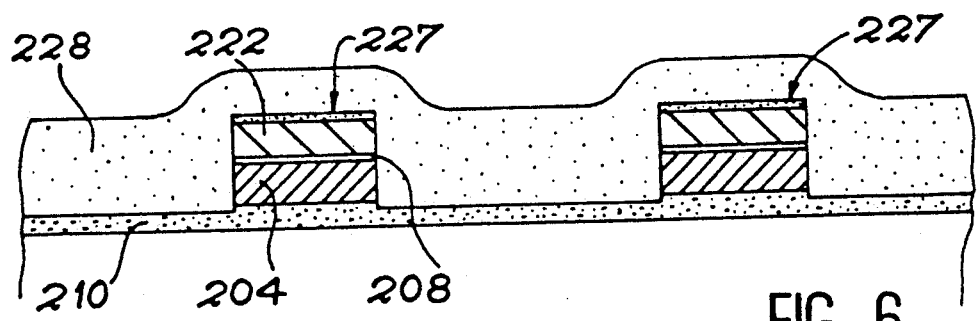

The etching of the stacking of the films 204, 208, 222 and 224 is then effected by dry etching, for example by reactive ionic etching by using sulfur hexafluoride $SF_6$ and thus coming to a stop inside the gate oxide 210. The masking resin 226 is then eliminated under vacuum via an oxygen plasma. The structure obtained is shown on FIG. 6.

Strips 227 of the stacking of the films 204, 208, 222 and 224 are obtained perpendicular to the direction x whose width is equal to the length of the floating gates to be embodied.

Next, the spacing strips or spacers are embodied. These spacers may be made of silicon oxide, silicon nitride or polycrystalline silicon. There now follows a description of one embodiment using silicon oxide spacers.

Figure 7:
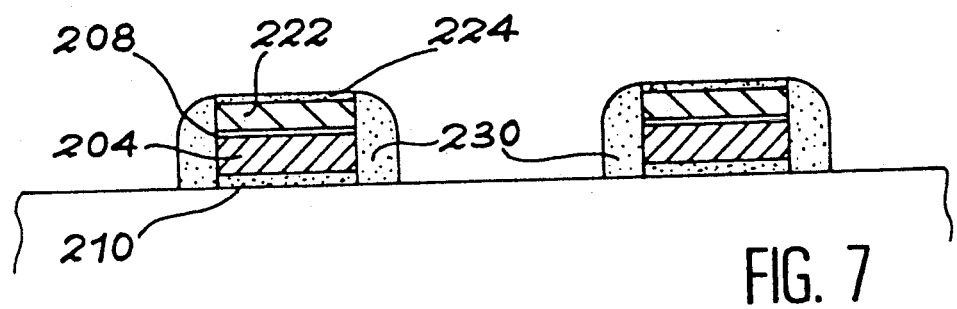

After the low pressure chemical vapor depositing at 800° C. of a silicon oxide film 228 from tetraethoxysilane (TEOS) and with a thickness of 400 nm (FIG. 6), an anisotropic etching is made of this oxide via plasma etching, gas $CHF_3$, so as to embody, as shown on FIG. 7, oxide spacers 230 with a width of 200 nm on the flanks of the strips 227 (over the entire length of the strips).

Figure 8:
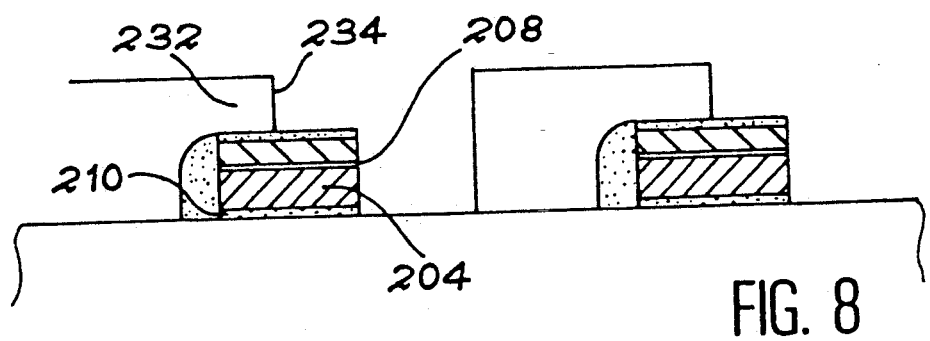

The elimination of the spacers on the side of the drains of the memory points to be embodied is then effected with the aid of a photolithographic mask 232 aligned on the stacking of the films and in particular on the poly-1 204, followed by a chemical etching with a solution of $FH-FNH_4$. The structure obtained is shown on FIG. 8. (The mask 232 comprises openings 234 opposite the substrate regions intended for the drains and one portion of each poly-1 strip 204).

After elimination of this resin mask by an oxygen plasma, the ionic implantation N+is made of the memory points with arsenic at an energy of 70 KeV and a dose of $3 \times 10^5$ at.cm2.

Figure 9:
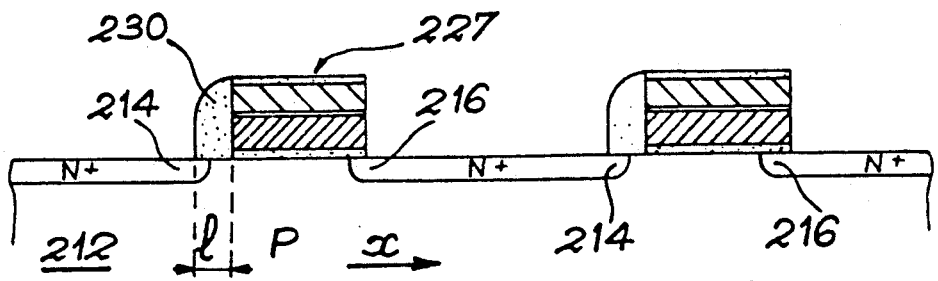

The structure obtained is the one shown on FIG. 9.

By means of the implantation of ions N+by using the etched film strips 227 and the remaining spacers 230 as an implantation mask, strips are obtained diffused in the substrate 212, said strips belong parallel to one another and perpendicular to the direction x of the channel of the memory points. The diffused zones are situated offset on the source side 214 by a constant distance 1 from each strip 227, whereas they are automatically aligned with respect to these strips 227 on the side of the drain 216 of the memory points.

Thus, the drains are self-aligned with respect to the floating gates and an offsetting 1 of the sources is obtained with respect to these gates.

Then the remaining spacers 230 on the source side are eliminated via a chemical etching by using a solution of $FH-FNH_4$.

Figure 10:
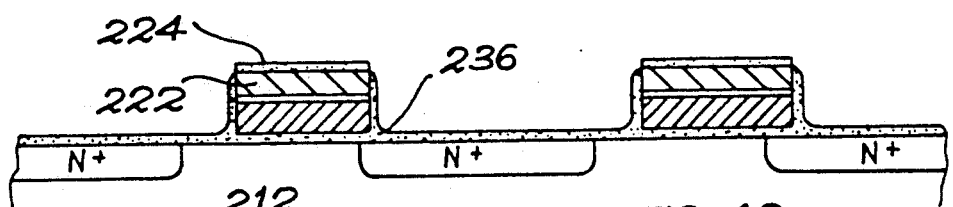

Then this ionic implantation is annealed, for example, at 850° C. for 30 minutes so as to make the implanted ions diffuse and electrically activate them. The structure obtained is the one shown on FIG. 10.

Then the source and drain zones are reoxidized 236 via thermic oxidation of the silicon 212 over a thickness of 20 nm at 1000° C. under dry oxygen.

Figure 11:
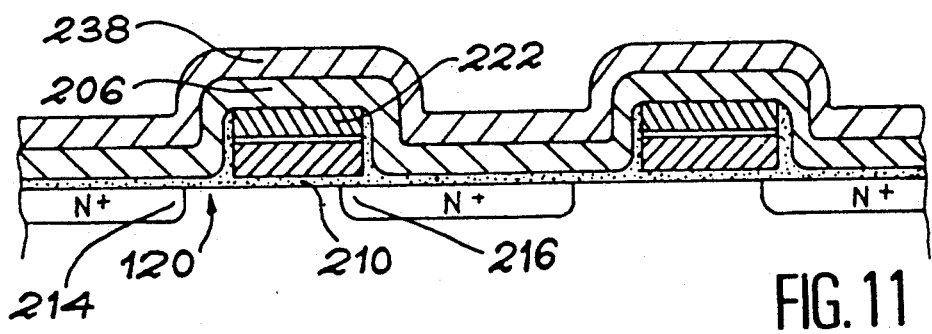

During this reoxidation, the nitride film 224 of each memory point prevents any thermic oxidation of the sub-jacent polycrystalline silicon film 222. Next, this silicon nitride film is eliminated by chemical etching with the aid of an orthophosphoric bath at 150° C. The structure obtained is shown on FIG. 11.

Then the upper polycrystalline silicon film 206 constituting the level of poly-2 is deposited by low pressure chemical vapor depositing at 620° C. and has a thickness of 250 nm. This silicon film 206 is then doped via the diffusion of phosphorus in an oven at 950° C. and with a concentration of between 0.5 and 2% in weight. Finally, a film of tungsten silicide 238 is advantageously deposited via low pressure chemical vapor depositing at 400° C. and has a thickness of 200 nm.

The poly-2 film 206 is in contact with the etched silicon film 222 and thus ensures electric contact with the lines of words.

Figure 12:
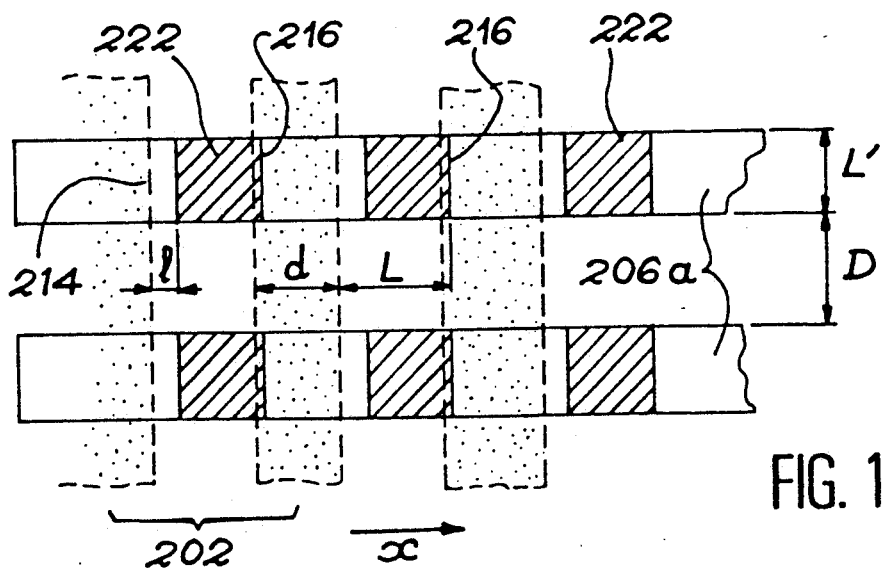

The method of the invention is then continued by masking the structure by a mask constituted by strips parallel to the direction x and then by the etching of the films 206 and 238 in the form of strips 206a, as shown on FIG. 12, constituting the lines of words. These strips 206a are perpendicular to the diffused strips 214 and 216 and are thus parallel to the direction x.

Then the strips 227 coming to a stop on the substrate are etched by using the mask for etching the lines of words 206a as a mask so as to obtain the final dimensions of the floating gates, the inter-gate nonconductors, the gate nonconductors and the control gates constituted here by the conductive blocks 222. The etching mask is then eliminated.

In accordance with the prior art, the peripheral transistors N and P of the memory are embodied, followed by depositing and then the creep or flow of one electric conductor film on the entire integrated circuit, the opening of contact holes in this nonconductor opposite the diffused zones 214 and 216 in particular, the metallization of the lines of bits and finally the passivation of the entire circuit with the aid of an electric nonconductor.

With the method of the invention, by using 0.6 $\mu$m drawing rules, it is possible to embody memory points 202 with a surface smaller than 2 $\mu$m2, whereas the smallest memory points curently published are between about 3.5 and 4 $\mu$m2.

It is thus possible to embody memory points with a surface of between 1.96 and 2.5 $\mu$m2, a floating gate width L' and a length L of respectively 0.6 $\mu$m : a distance D separating two lines of words 206a of 0.8 $\mu$m; a width L' of the lines of words 206a of 0.6 $\mu$m ; and a distance d separating two floating gates of 0.8 $\mu$m.

With drawing rules of 0.4 μm (L=L'=0.4 μm), it is possible to obtain memory points with a surface of 1.5 μm2.

Thus, the distance 1 (fixed by the width of the spacers) is 0.2 μm which corresponds to the offsetting between the source and the stacking of the gates of one memory point. This separation zone defines the MOS access transistor connected in series with the gates. It bears the reference 120 on FIG. 11. The length of its channel is equal to 1.

Figure 13:
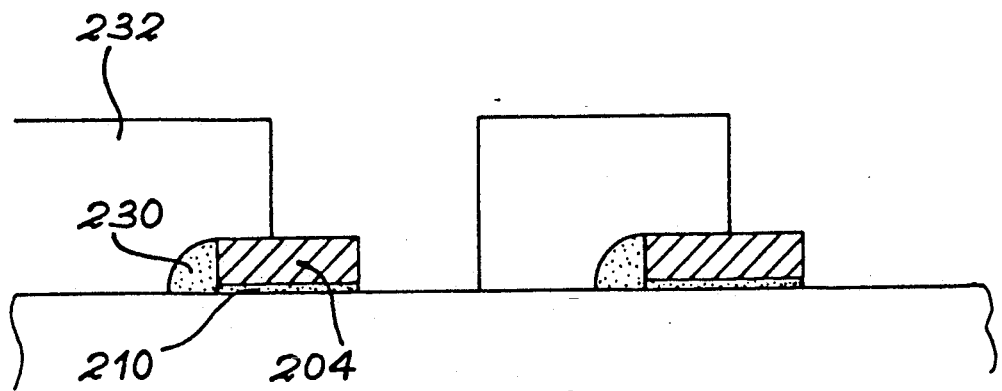
Figure 14:
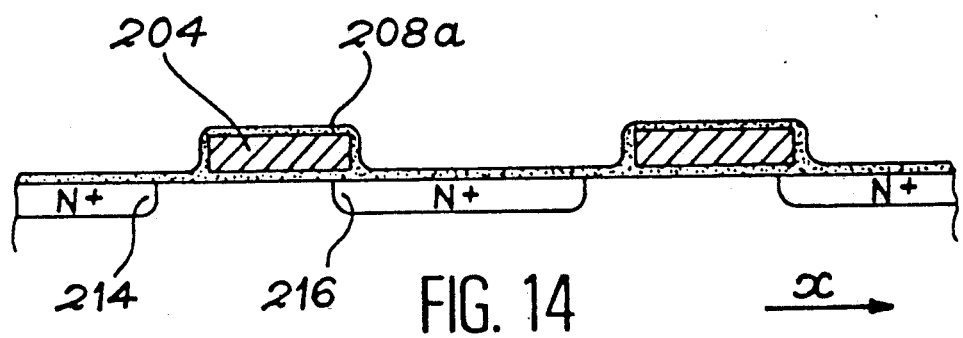
Figure 15:
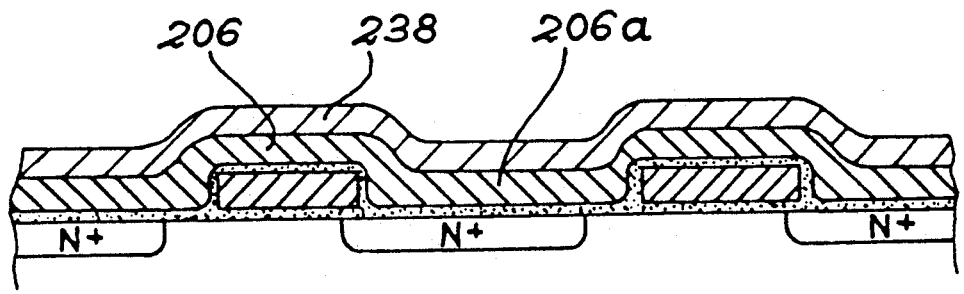

FIGS. 13 to 15 show one variant of the method of the invention. In this variant, the inter-gate nonconductor is embodied during reoxidation of the sources and drains of the memory points. Thus, it is no longer necessary to use the polycrystalline silicon film 222 or the nitride film 224.

Also, as shown on FIG. 13, after the depositing of the gate nonconducting film 210 and then the poly-1 silicon film 204, this stacking is etched so as to fix the length of the floating gate. Then a silicon oxide film 400 nm thick, intended to to form the spacers, is deposited on the entire structure, followed by an etching of this film so as to form the spacers 230.

After formation of the lithographic mask 232 allowing for the self-alignment of the drains with respect to the floating gate 204 and the offsetting of the sources, the spacers on the drain side are eliminated and then the resin mask 232 used for this elimination is also eliminated. The structure obtained is shown on FIG. 14.

After the implantation N+, as described earlier, the remaining spacers on the source side are eliminated and then the sources and drains of the memory points are reoxidized and the floating gates 204 are oxidized. Thus, an inter-gate nonconductor 208a made of silicon oxide 20 nm thick is obtained.

The method is continued, as shown on FIG. 15, via the depositing of the polycrystalline silicon film (poly-2) 206 and the silicide film 238. The rest of the method remains unchanged.

What is claimed is:

1. Method for producing a non-volatile memory cell on a semiconductive substrate with a given type of conductivity and comprising :
   a) - a matrix of memory points electrically isolated from one another and each provided with a stacking of one floating gate and one control gate, both gates electrically isolated from each other, one gate nonconductor inserted between the floating gate and the substrate, one source and one drain both formed in the substrate on both sides of the stacking, one channel situated under the floating gate and having a length orientated along a direction extending from the source to the drain, and one access transistor connected in series to the stacking of gates,
   b) - lines of words constituted by conductive strips parallel to this direction, this method including the following stages :
   1) - embodying on the substrate a stacking of one electric nonconductive film and one conductive film respectively intended to form the gate nonconductors and the floating gates,
   2) - etching of this stacking of films so as to form the strips of said stacking, said strips being perpendicular to said direction,
   3) - embodying of spacing strips on the flanks of the strips of said stacking made of a nonconducting material able to be selectively etched with respect to the conductive film of the stacking and to the substrate,
   4) - elimination of the spacing strips on the side of the drains to be embodied,
   5) - implantation of ions with a type of conductivity differing from that of the substrate by using the remaining spacing strips and the strips of said stacking as a mask so as to form the sources and drains of the transistors, respectively offset and aligned with respect to the strips of said stacking,
   6) elimination of the remaining spacing strips,
   7) formation of a thin electric nonconductive film on the sources and drains of the transistors and on the strips of said stacking,
   8) - embodying of conductive strips on the strips of said stacking, these conductive strips being parallel to said direction and thus forming the control gates and the lines of words, and
   9) - etching of the strips of said stacking by using said conductive strips as a mask so as to fix the dimensions of the floating gates and the gate nonconductors.

2. Method according to claim 1, wherein the substrate and the floating gates are made of silicon and wherein the thin nonconducting film is obtained by oxidizing the silicon.

3. Method for producing a non-volatile memory cell on a semiconductive substrate with a given type of conductivity and comprising :
   a) - a matrix of memory points electrically isolated from one another and each provided with a stacking of one floating gate and one control gate, both gates electrically isolated from each other, one gate nonconductor inserted between the floating gate and the substrate, one source and one drain, both formed in the substrate on both sides of the stacking, one channel situated under the floating gate and having a length orientated along a direction extending from the source to the drain, and one access transistor connected in series to the stacking of gates,
   b) - lines of words constituted by conductive strips parallel to this direction, this method including the following stages :
   i) - embodying on the substrate a stacking of one first electric nonconducting film intended to form the gate nonconductors, one first conductive film intended to form the floating gates, at least one second electric nonconducting film intended to form the intergate nonconductors, one second conductive film intended to embody the control gates and one protection film able to be selectively etched with respect to the second conductive film,
   ii) - etching of this stacking of films so as to form the strips of said stacking, said strips being perpendicular to said direction,
   iii) - embodying of spacing strips on the flanks of the strips of said stacking, these strips being made of a nonconductive material able to be selectively etched with respect to the protection film and to the substrate,
   iv) - elimination of the spacing strips on the side of the drains to be embodied,
   v) - implantation of ions with a type of conductivity differing from that of the substrate by using the remaining spacing strips and the strips of the stacking of films as a mask so as to form the sources and drains of the transistors respectively displaced and aligned with respect to the strips of said stacking, vi) - elimination of the remaining spacing strips, vii) - formation of a thin electric nonconducting film on the sources and drains of the transistors, viii) - elimination of the protection film, ix) - embodying of conductive strips on the strips of said stacking obtained at viii), these conductive strips being parallel to said direction and thus forming the lines of words, and x) - etching of the strips of said stacking obtained at viii) by using said conductive strips as a mask so as to fix the dimensions of the control gates, the intergate nonconductors, the floating gates and of the gate nonconductors.

4. Method according to claim 3, wherein the intergate nonconductor is made of a silicon oxide, silicon nitride and silicon oxide trifilm material.

5. Method according to claim 3 or 4, wherein the second conductive film is composed of doped polycrystalline silicon.

6. Method according to claim 5, wherein the protection film is composed on silicon nitride.

7. Method according to claim 1, wherein the conductive strips are made of a bifilm material.

8. Method according to claim 1, wherein an annealing is carried out after the implantation of ions so as to make these ions diffuse inside the substrate and activate them.

9. Method according to claim 3, wherein the conductive strips are made of a bifilm material.

10. Method according to claim 3, wherein an annealing is carried out after the implantation of ions so as to make these ions diffuse inside the substrate and activate them.

* * * * *